United States Patent
Yoshida et al.

(10) Patent No.: US 6,861,933 B1
(45) Date of Patent: Mar. 1, 2005

(54) SUPERCONDUCTIVE MAGNET DEVICE

(75) Inventors: Naoji Yoshida, Tokyo (JP); Hajime Tanabe, Tokyo (JP); Shigenori Kuroda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/652,319

(22) Filed: Sep. 2, 2003

Related U.S. Application Data

(62) Division of application No. 10/120,358, filed on Apr. 12, 2002, now Pat. No. 6,707,359.

(30) Foreign Application Priority Data

May 17, 2001 (JP) .................................... P2001-148359
Jun. 5, 2001 (JP) .................................... P2001-170189

(51) Int. Cl.[7] ................................................ G01V 3/00
(52) U.S. Cl. ........................ 335/301; 324/319; 324/320
(58) Field of Search ........................ 335/216, 296–301; 324/318–320

(56) References Cited

U.S. PATENT DOCUMENTS

| | | |
|---|---|---|
| 4,748,412 A | 5/1988 | Yamamoto et al. |
| 4,771,243 A | 9/1988 | Vreugdenhil et al. |
| 5,414,399 A | 5/1995 | Breneman et al. |
| 5,550,472 A | 8/1996 | Richard et al. |
| 5,565,831 A | 10/1996 | Dorri et al. |
| 5,999,076 A | 12/1999 | Becker, Jr. et al. |
| 6,147,495 A * | 11/2000 | DeMeester et al. ......... 324/320 |
| 6,169,404 B1 | 1/2001 | Eckels |
| 6,218,838 B1 | 4/2001 | McGinley et al. |

FOREIGN PATENT DOCUMENTS

| | | |
|---|---|---|
| JP | 9-238917 | 9/1997 |
| JP | 10-127602 | 5/1998 |
| JP | 10-328159 | 12/1998 |

* cited by examiner

Primary Examiner—Ramon M. Barrera
(74) Attorney, Agent, or Firm—Sughrue Mion, PLLC

(57) ABSTRACT

A superconductive magnet device comprises a pair of oppositely disposed superconductive bodies in which annular superconductive coils are accommodated, and fine chip-shaped ferromagnetic shims disposed on a surface of the pair of superconductive magnet bodies so as to improve uniformity of magnetic field in a uniform magnetic field in a uniform magnetic field space generated in the proximity of the center between the superconductive magnet bodies, wherein ring-shaped ferromagnetic shims are disposed concentrically with the center of annular superconductive coils on the surface of the superconductive magnet bodies.

7 Claims, 15 Drawing Sheets

[Fig. 1]
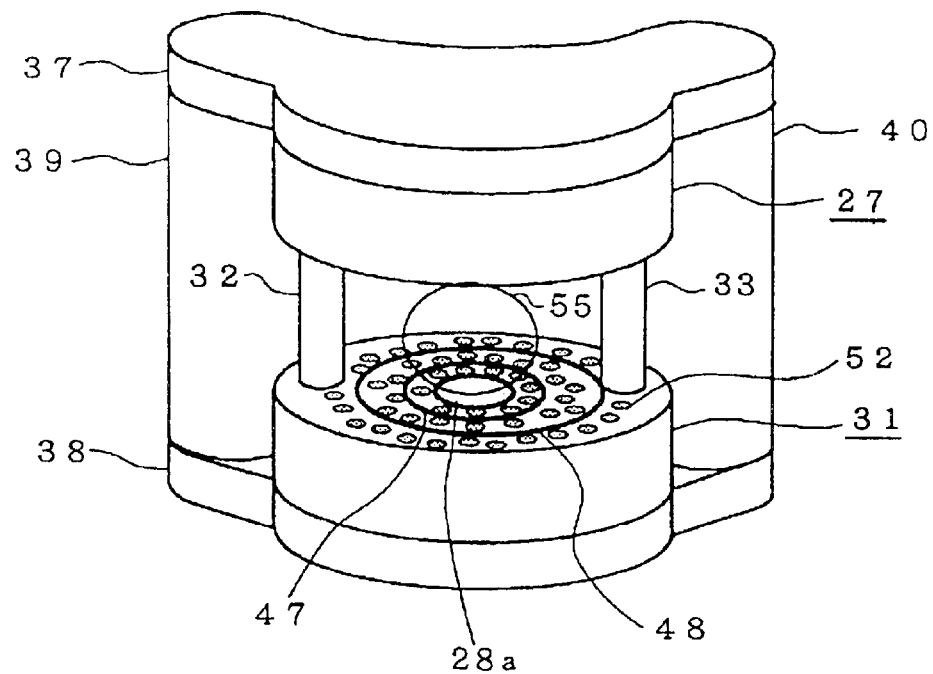
[Fig. 2]
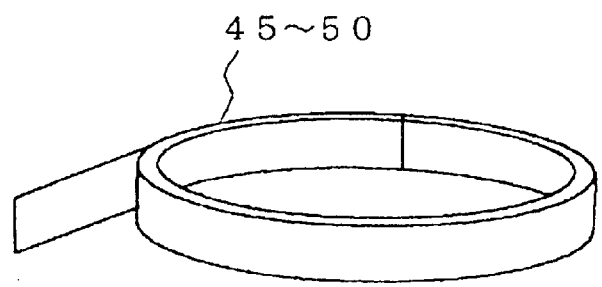

[Fig.3]
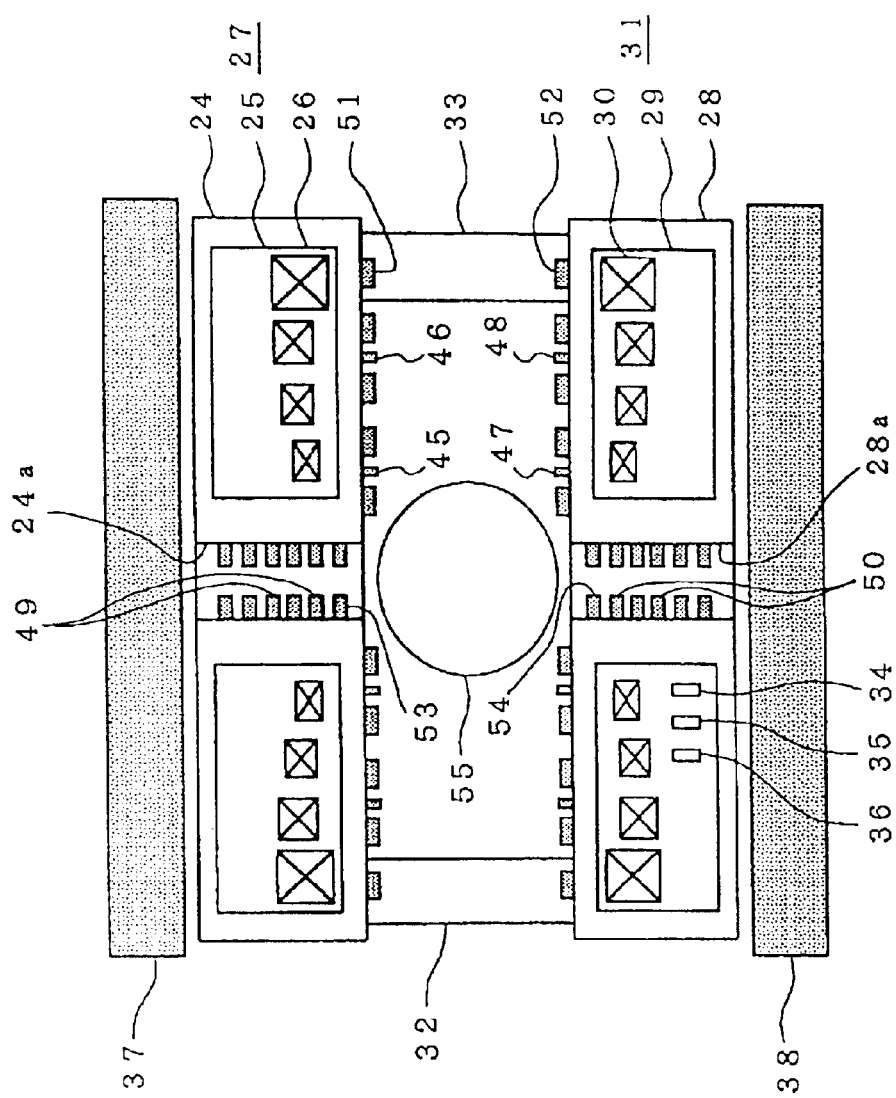

[Fig. 4]
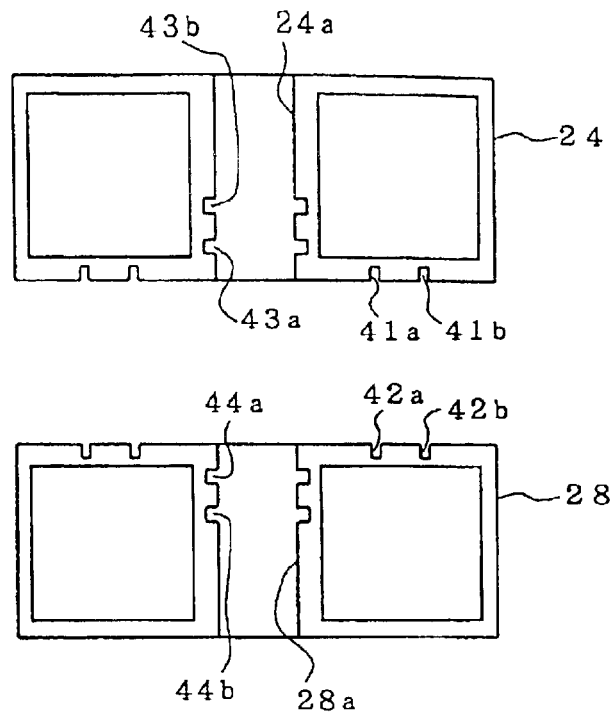
[Fig. 5]
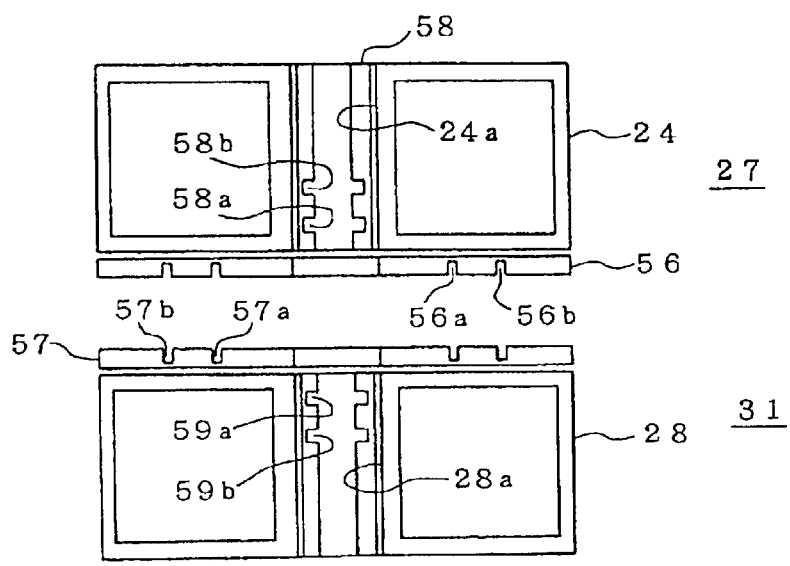

[Fig. 6]
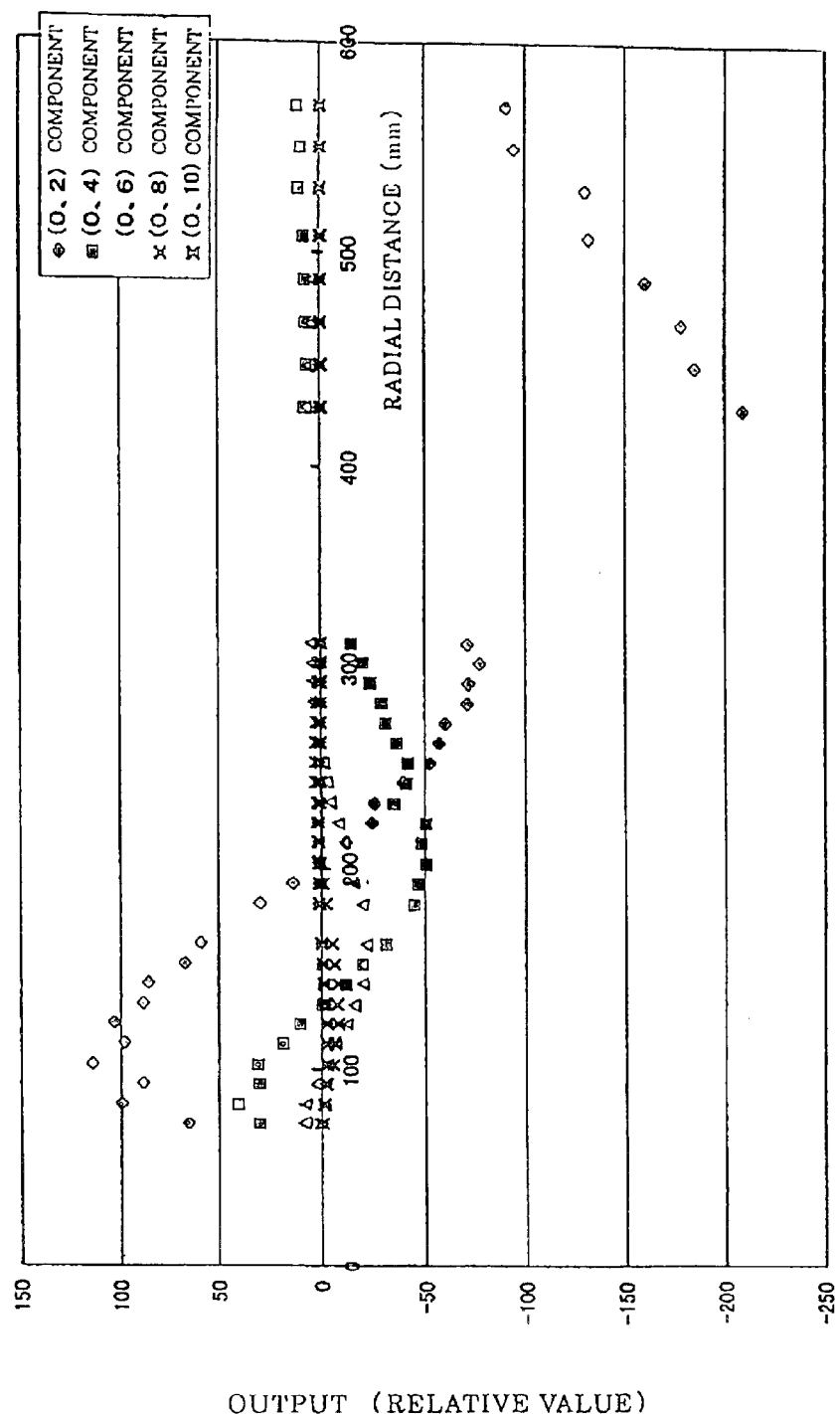

[Fig. 7]
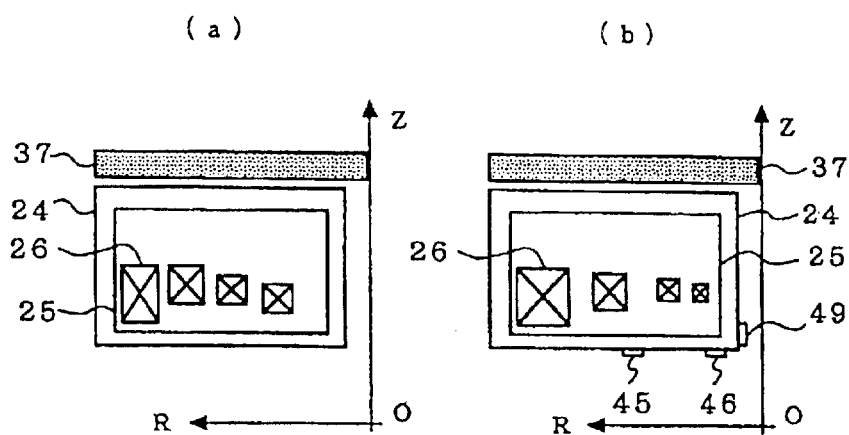
[Fig. 8]
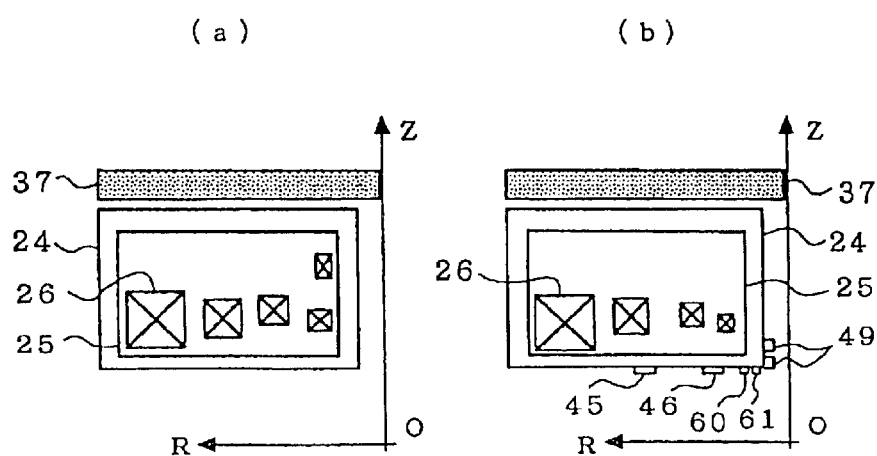

[Fig. 9]
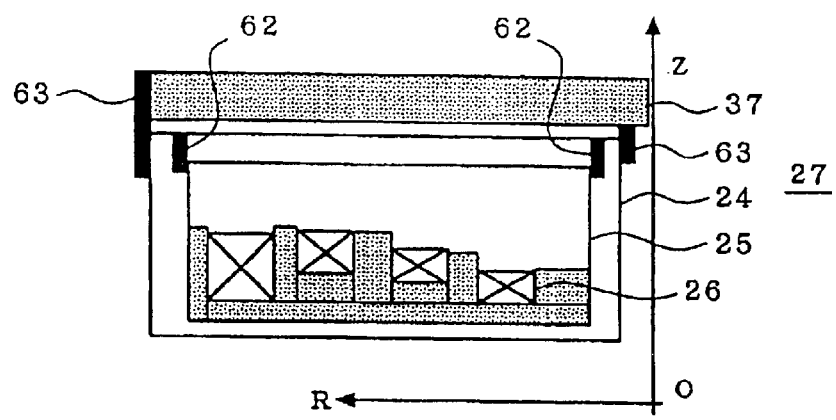
[Fig. 10]
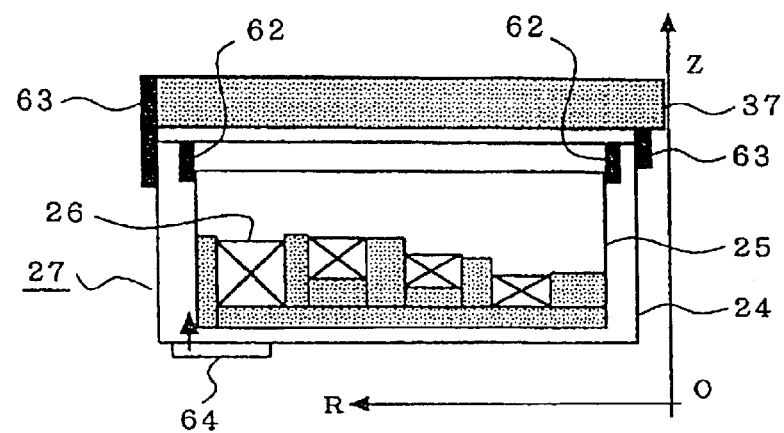

[Fig. 1 1]
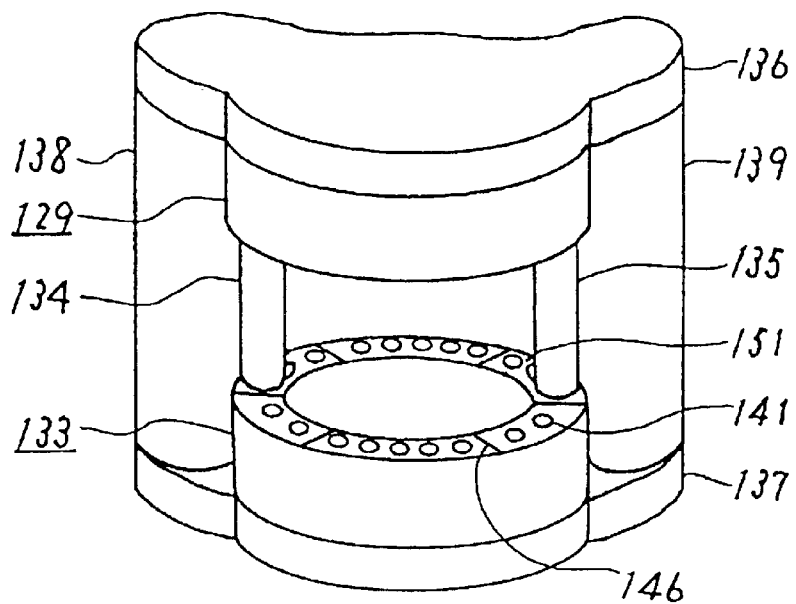

[Fig. 1 2]
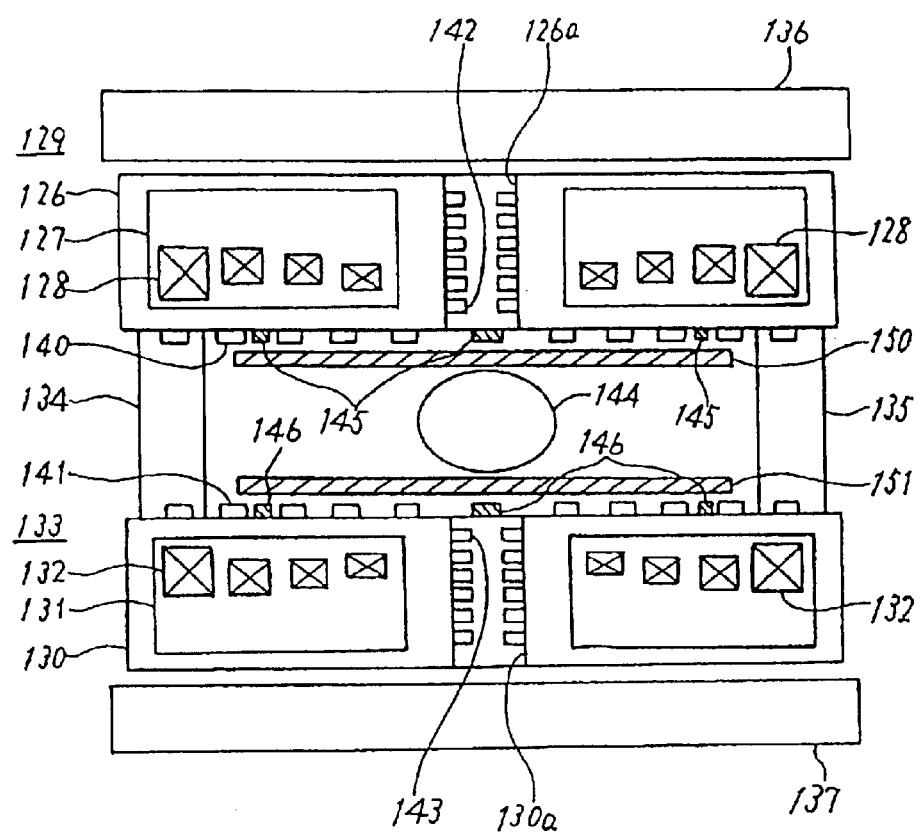

[Fig. 1 3]
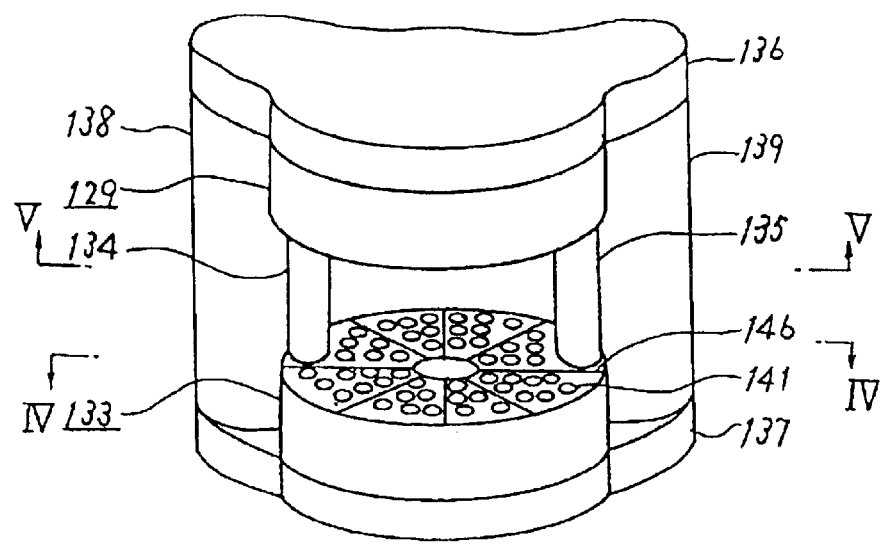

[Fig. 1 4]
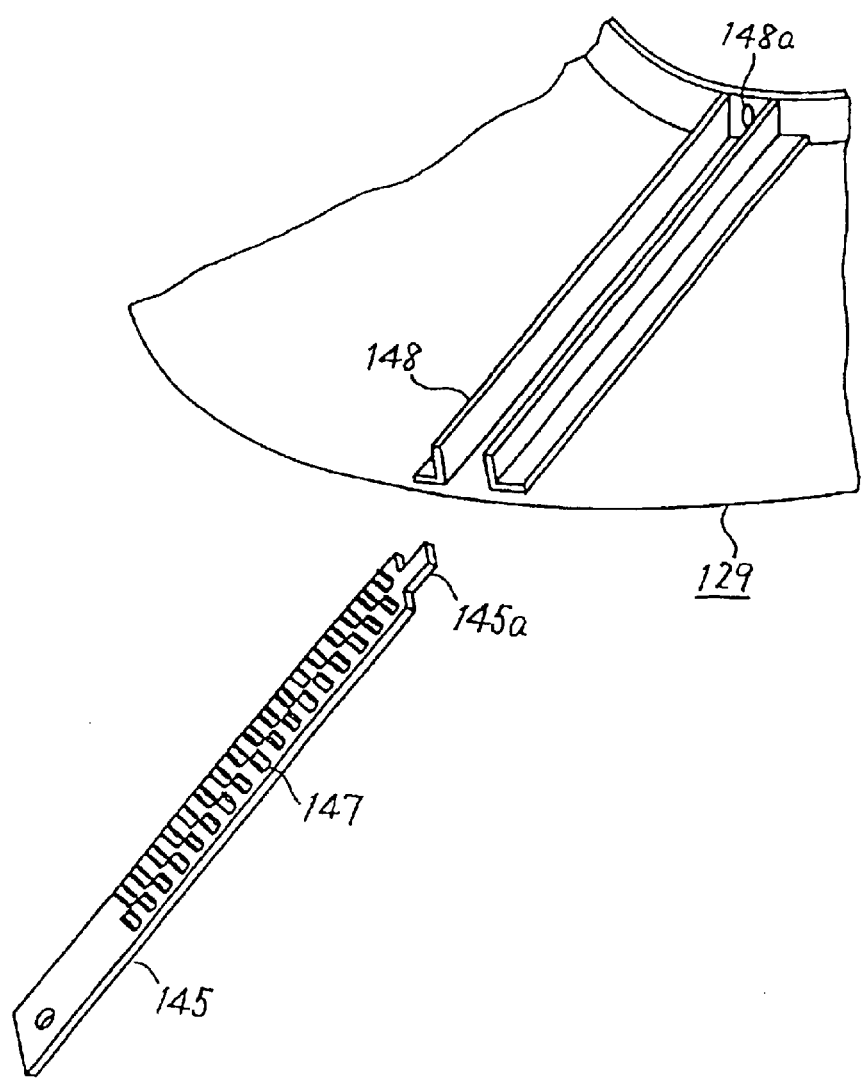

[Fig. 1 5]
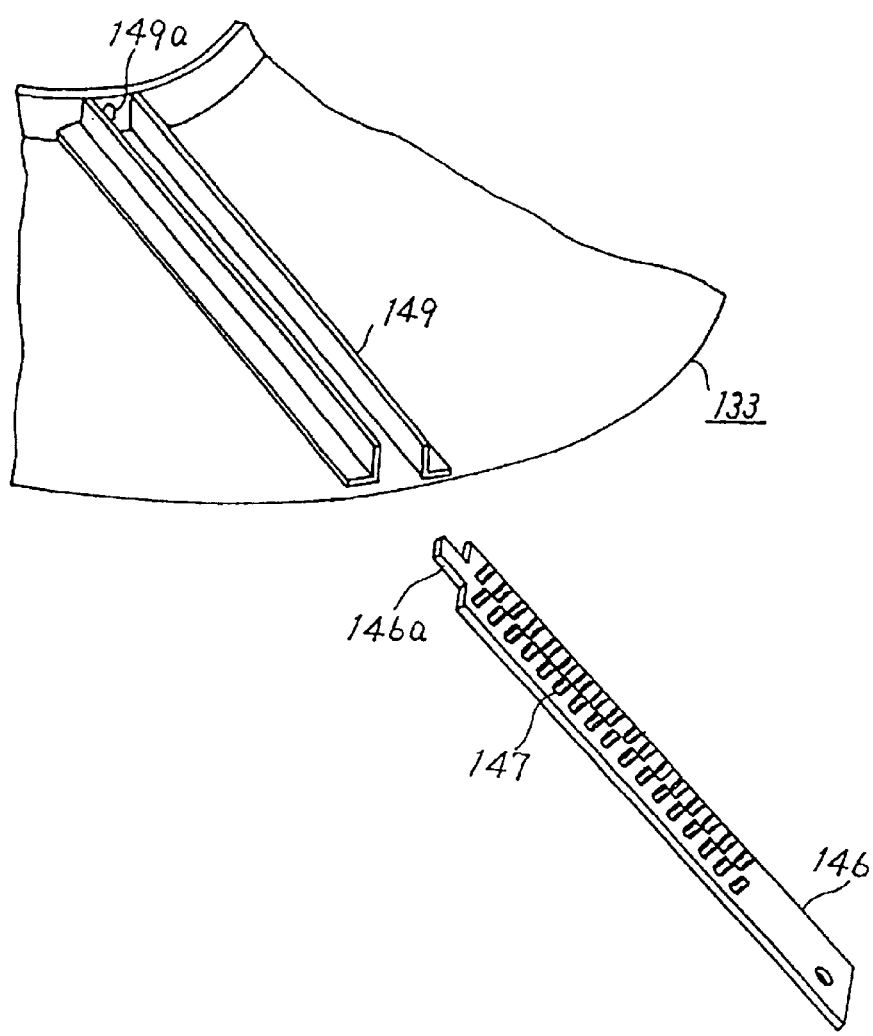

[Fig. 16]
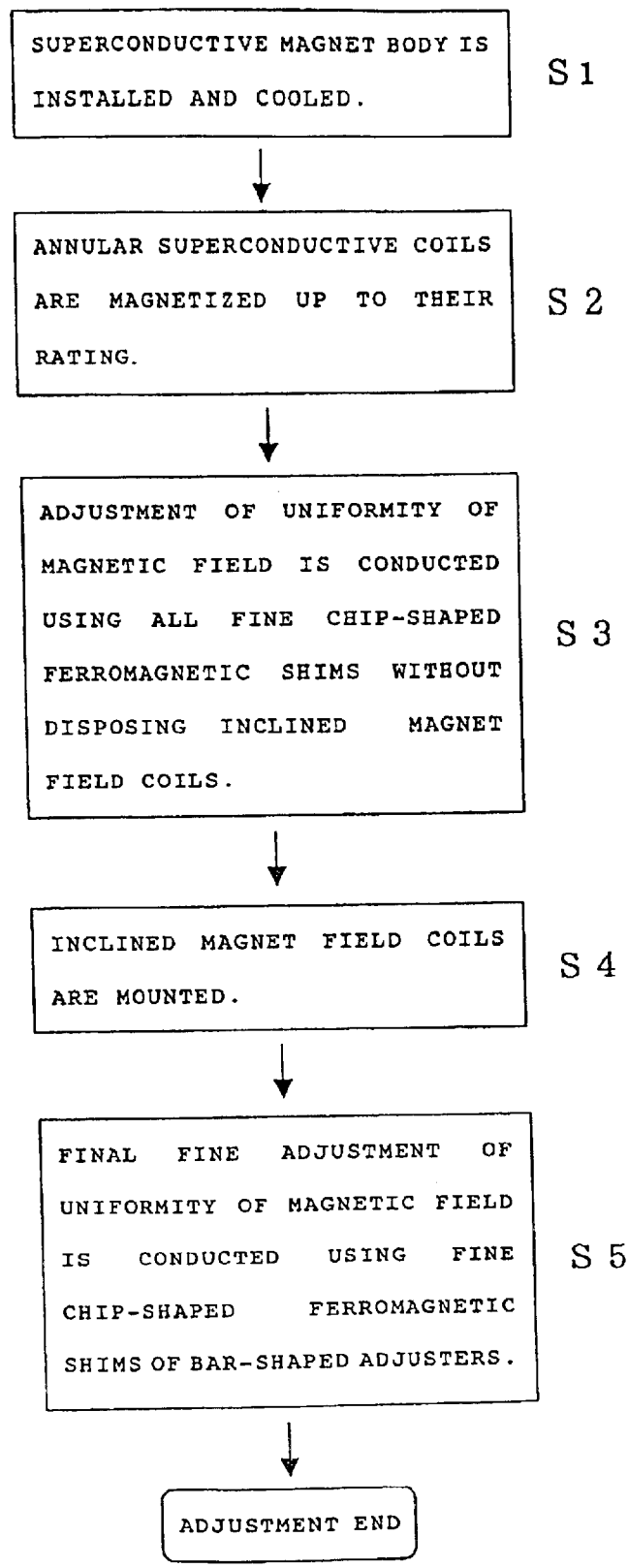

[Fig. 17]
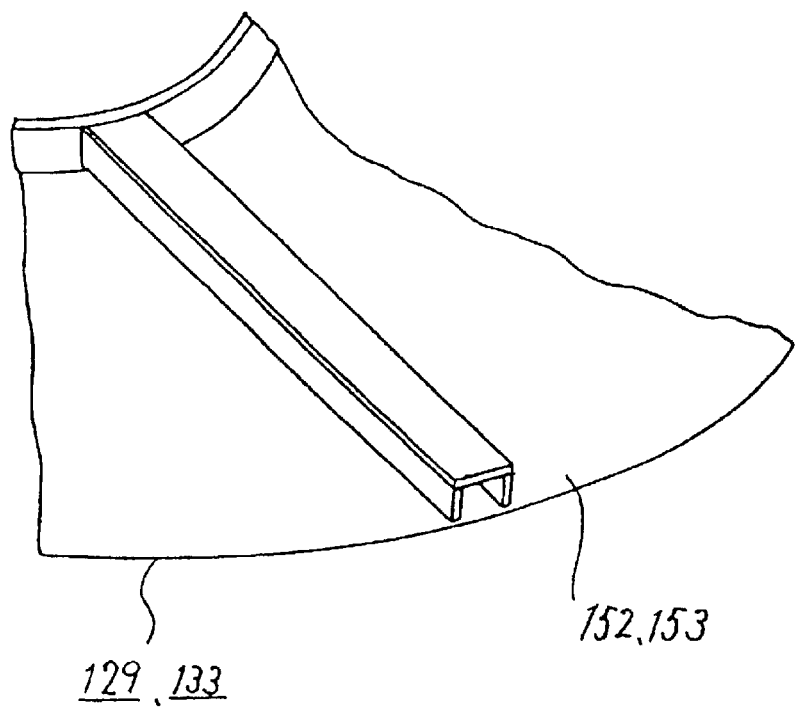
[Fig. 18]
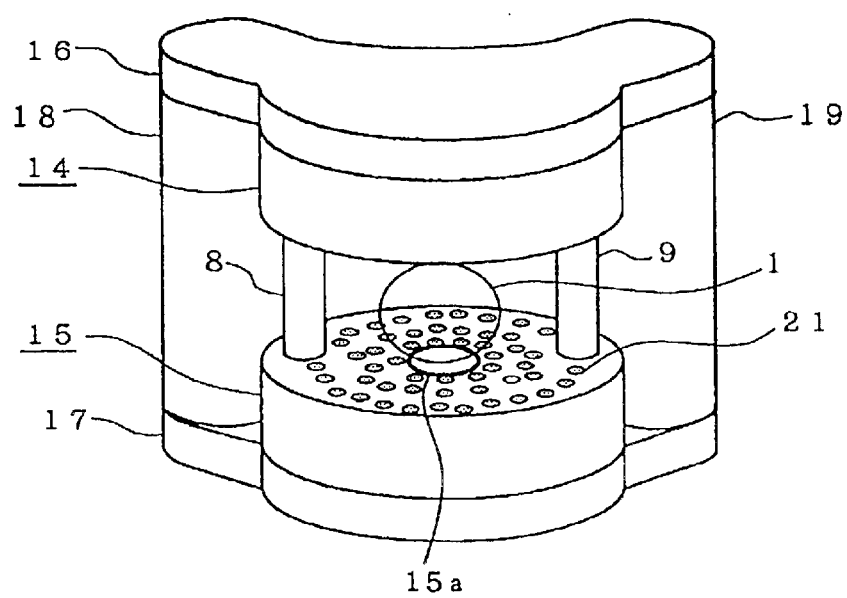

[Fig. 1 9]
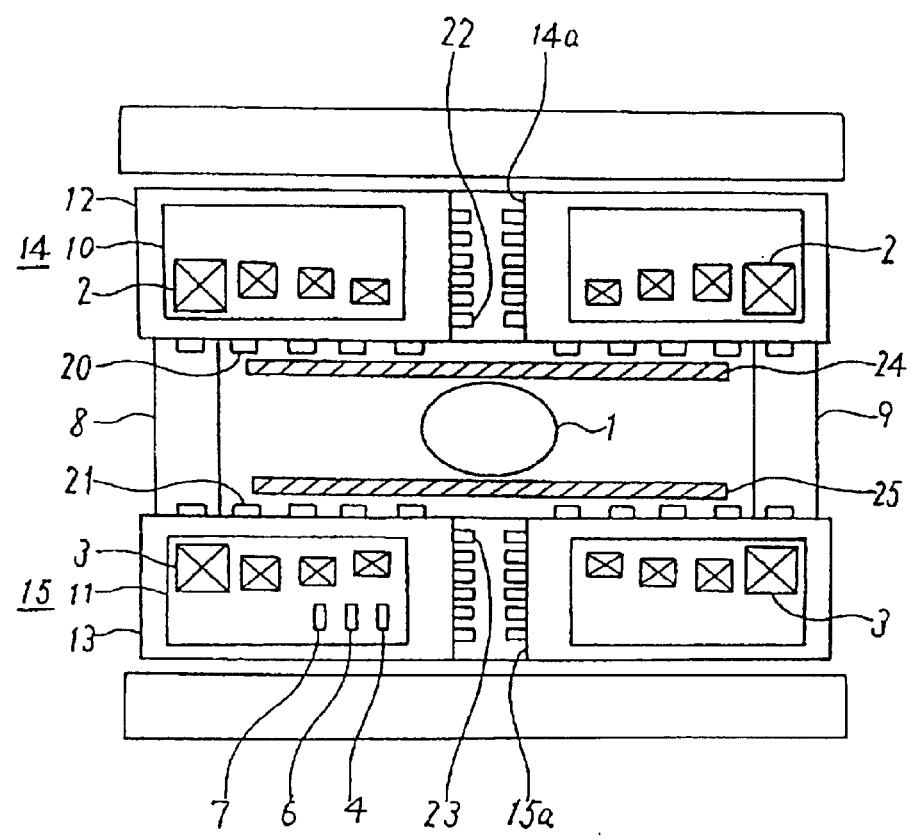

[Fig. 2 0]
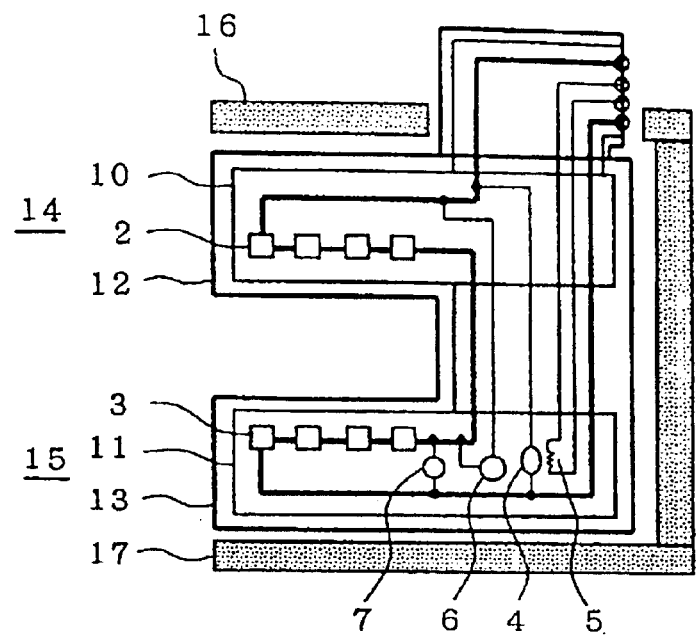
[Fig. 2 1]
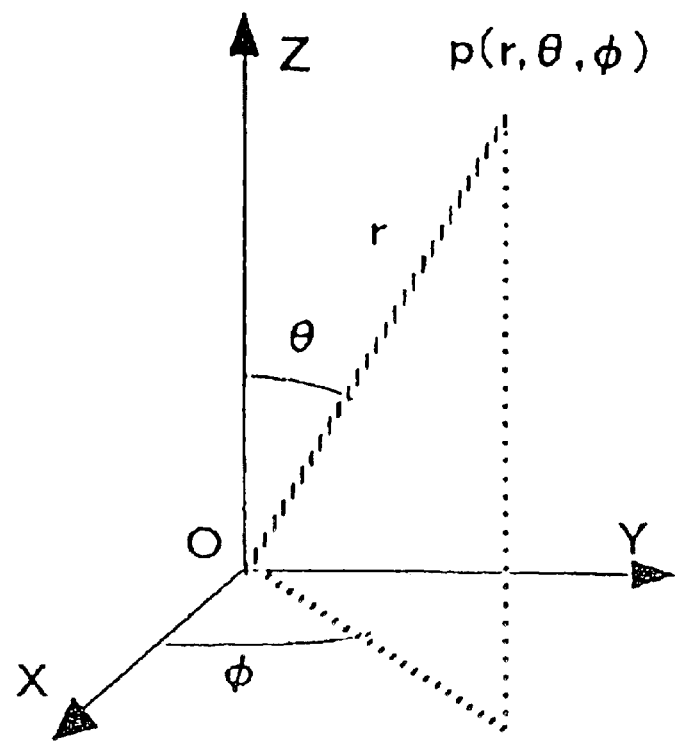

SUPERCONDUCTIVE MAGNET DEVICE

This is a divisional of application Ser. No. 10/120,358, filed Apr. 12, 2002 now U.S. Pat. No. 6,707,359; the disclosure of which is incorporated by reference.

BACKGROUND OF THE INVENTION

1. Field of the Invention

The present invention relates to a superconductive magnet device to improve uniformity of a uniform magnetic field space between a pair of superconductive magnet bodies.

2. Background Art

Recently superconductive magnet devices have come to be widely used as a generating source of a static magnetic field that has a high intensity and a temporal stability. In particular, superconductive magnet devices have been popularly employed as a generating source of a static magnetic field in medical tomography equipment (magnetic resonance imaging equipment) or silicon single crystal pickup devices. Most of those conventional superconductive magnet devices were of cylindrical solenoid type, while more popularly used recently are such devices provided with two superconductive magnets horizontally or vertically opposed each other with a large clearance therebetween in order to utilize their large opening and spacious magnetic field area.

In the field of superconductive magnet devices for MRI equipment, for example, a vertically opposed type superconductive magnet device provided with a wide opening is rapidly increasing, which brings about a comfort of roominess to a patient while providing a better accessibility to the patient for an examination staff.

FIG. 18 is a perspective view showing an appearance of, for example, a vertically opposed type superconductive magnet device used in MRI equipment, and FIG. 19 is a schematic sectional drawing and FIG. 20 is a schematic circuit diagram thereof, respectively. Referring to FIGS. 18 to 20, (1) high intensity of magnetic field, (2) temporal stability of magnetic field, and (3) uniformity of magnetic field are required as a performance of magnetic field in image pickup area 1 of a superconductive magnet device for MRI.

Moreover, it is also required to reduce the amount of evaporation of liquid helium and to reduce leak magnetic field. For the purpose of attaining a high magnetic field intensity satisfying a required performance of a magnetic field of a vertically opposed type superconductive magnet device for MRI, current density of annular superconductive coils 2, 3 is increased so that an intense magnetic field is generated. Also, for the purpose of attaining temporal stability of the magnetic field, a permanent current switch 4 is employed for permanent current mode operation so that a magnetic field becomes temporally super-stable. Further, for the purpose of attaining uniformity of the magnetic field, a plurality of annular superconductive coils 2, 3 are provided so that a higher uniformity is achieved. Then the respective annular superconductive coils 2, 3 are connected in series, through which an identical current is applied. A permanent current switch 4 is connected in parallel to these annular superconductive coils 2, 3, and ON/OFF of the permanent current switch 4 is conducted by applying or interrupting a current to a heater 5 for the permanent current switch for magnetization or demagnetization, thereby a permanent current mode being achieved. Coil protecting elements 6, 7 are provided at appropriate points for protection against a high voltage generated at the time of normal conduction transition (quench) in the magnetization or demagnetization. Current leads between coils, and a part of leads for the permanent current switch 4 or the coil protecting elements 6, 7 are connected through connecting tubes 8, 9.

For the purpose of reducing evaporation amount of liquid helium, cryogenic containers 10, 11 are entirely covered with vacuum adiabatic containers 12, 13 and, further, one or two thermal shield baths (not shown) or superinsulation materials (not shown) are provided between the cryogenic containers 10, 11 and the vacuum adiabatic containers 12, 13. In addition, the annular superconductive coils 2, 3, the cryogenic containers 10, 11 and the vacuum adiabatic containers 12, 13 form superconductive magnet bodies 14, 15 as a whole. Also, the thermal shield baths are cooled by a refrigerator not shown. For the purpose of lowering leak magnet field, upper and lower magnetic shield plates 16, 17 made of a ferromagnetic member are provided outside the respective vacuum adiabatic containers 12, 13, and yokes of a ferromagnetic body 18, 19 are placed between the magnetic shield plates 16, 17 to secure them.

In designing a superconductive magnet device, number of units of annular superconductive coils is determined, and also dimensions, positioning, number of windings, current density, etc. of the annular superconductive coils 2, 3 are strictly determined taking into consideration a magnetic field generated in the image pickup area 1 by magnetic moment of yokes 18, 19 made of a ferromagnetic material, in such a manner that all the error magnetic field components become substantially zero. In the case of a superconductive magnet device for MRI, in general, a deviation of 1 mm in dimensions or positioning will result in an influence mounting to several tens ppm in overall error magnetic field components.

Accordingly, in designing the superconductive magnet device, the dimensions, positioning, number of windings or current density have to be determined through a strict optimization so that all the error magnetic field components become substantially zero, while it is usual that uniformity of a magnetic field has a range of several hundreds ppm when actually magnetized, because of dimension tolerance in the manufacture or magnetism existing in the employed materials, etc. Particularly in the design of a vertically split type superconductive magnet device, the uniformity tends to be inferior, as compare with the conventional cylindrical solenoid type superconductive magnet device, to such an extent that a positioning error between upper and lower superconductive magnet bodies 14, 15 is added.

For the purpose of compensating the uniformity deteriorated to over hundreds ppm, as well as circumstantial influences due to magnetism of structural steel of a room in which a superconductive magnet device is installed or that of peripheral equipments, thereby improving the uniformity in the state of practical use, iron shims in the form of fine chips have been conventionally used.

Referring to FIGS. 18 and 19, reference numerals 20, 21 are iron shim chips mounted on the gap side surface of the superconductive magnet bodies 14, 15, numerals 22, 23 are iron shim chips mounted on bore portions 14a, 15a respectively provided at the center of superconductive magnet bodies 14, 15. In mounting the iron shim chips 20 to 23, from the viewpoint of adjusting the uniformity in the image pickup area 1, a smaller amount of iron shim chips can perform a greater compensation effect in the central region of the gap side surface closer to the image pickup area 1, and in a region closer to the gap within the bore portions 14a, 15a.

In this manner, the uniformity of magnetic field can be improved by placing a plurality of iron shim chips 20 to 23 on the gap side surface of the upper and lower superconductive magnet bodies 14, 15 and in central bore portions 14a, 15a, as well as by adjusting number of the iron shim chips 20 to 23. Practically, magnetic moment of the iron shim chips 20 to 23 and magnetic field components generated by the magnetic moment in the image pickup area 1 must be precisely analyzed in advance based on the magnetic field intensity applied to the iron shim chips 20 to 23 of the respective positions, and then compensation amount of each of the magnetic field components must be determined based on the analysis of error magnetic field components that generate a uniformity of several hundreds ppm, thereby optimizing the positions and quantity of the iron shim chips 20 to 23 to be mounted. Usually, it is difficult to attain a desired uniformity in just one execution of works, and therefore the process has to be repeated several times thus gradually improving the uniformity.

In general, intensity of magnetic field in the image pickup area 1 is obtained by the following formula (1) through a development of Legendre function. Codesy θφ) in the formula are illustrated in FIG. 21.

[Formula 1]

$$Bz(y, \theta, \phi) = \sum_{n=0}^{\infty}\sum_{m=0}^{n} y^n p_n^m(\cos\theta)\{{}_n^m a\cos(m\phi) + {}_n^m b\sin(m\phi)\} \quad (1)$$

where: $a_n^m$, $b_n^m$ are coefficients of components determined by the form of magnetic field.

A magnetic field is referred to as a component in the form of (m, n) values developed by Legendre function. (0, 0) component is a desired uniform magnetic field component, and all others are non-uniform error magnetic field components in the image pickup area. Among the error magnetic field components, the components being m=0, i.e. (0, n) components are collectively referred to as Z components, and those being m≠0 are collectively referred to as R components.

In this manner, after adjusting uniformity of a magnetic field by the fine chip-shaped ferromagnetic shims 20 to 23, gradient magnet field coils 24, 25 are disposed directly over the fine chip-shaped ferromagnetic shims 20, 21 between the respective superconductive magnet bodies 14, 15 as shown in FIG. 19, for generating an gradient magnet field to be applied in the form of pulsation to the image pickup area 1 at the time of picking up an image.

In the conventional superconductive magnet device of above arrangement, the plurality of iron shim chips 20 to 23 are placed in the proximity of image pickup area 1 on the gap side surface of the superconductive magnet bodies 14, 15 as well as in the central bore portions 14a, 15a for adjusting uniformity of the image pickup area 1, and the uniformity can only be gradually improved by optimizing positions and number of the iron shim chips and repeating adjusting. Therefore, a problem exists in that it is more difficult to compensate (0, n) components, i.e., Z components among the error magnetic field components than to compensate R components, and the greater the n value becomes the more difficult the adjustment of uniformity becomes.

Also, in the conventional superconductive magnet device of above arrangement, the gradient magnet field coils 24, 25 are disposed right above the iron shim chips 20, 21 between the respective superconductive magnet bodies 14, 15, after adjusting uniformity of the magnetic field by the iron shim chips 20 to 23. Therefore an error magnetic field is generated due to a minute magnetism contained in component members of the gradient magnetic field coils 24, 25 or to a slight flexure of the vacuum adiabatic containers 12, 13 caused by weight of gradient magnetic field coils 24, 25. However, as the gradient magnetic field coils 24, 25 are formed by molding together not less than 6 pieces of flat plate type coils of complicated shape, it is usually impossible to provide a number of holes on the disc surface. Further, to make the image pickup area 1 as large as possible, in other words, to have the gap between the superconductive magnet bodies 14, 15 as large as possible, the gradient magnetic field coils 24, 25 are disposed close to the fine chip-shaped ferromagnetic shims 20, 21 in such a manner as nearly in close contact with each other. As a result, it is impossible to dispose or remove the iron shim chips 20, 21 in a region covered with the gradient magnetic field coils 24, 25.

To overcome the mentioned problems, the following final adjustments have been conventionally performed under the condition of gradient magnetic field coils 24, 25 being disposed.

(1) Adjust the uniformity by superimposing a small amount of direct current on the gradient magnetic field coils 24, 25 together with the pulsating current that generates a pulsating magnetic field.

(2) Dispose iron shim chips on a directly accessible region of the surface or side faces of vacuum adiabatic containers 12, 13, without being covered with the gradient magnetic field coils 24, 25.

(3) Dispose iron shim chips on the surface of or inside of the gradient magnetic field coils 24, 25.

(4) Add current shim coils.

However, the item (1) is applicable only to compensation of (0, 1) and (1, 1) components of Legendre function development. The item (2) does not provide a significant effect since the adjustment area is far from the image pickup area 1. The item (3) can provide a superior compensation effect but largely depends on the precision of the gradient magnetic field coils. And the item (4) will brings such disadvantages that the current shim coils and power supply device will be more costly, and moreover the image pickup area 1 will be narrower since the current shim coils are additionally placed.

SUMMARY OF THE INVENTION

The present invention was made to solve the above-discussed problems, and has an object of providing a superconductive magnet device in which uniformity of magnetic field can be easily adjusted.

Another object of the invention is to provide a superconductive magnet device in which uniformity of magnetic field can be easily adjusted even under the condition that gradient magnetic field coils are mounted.

To accomplish the foregoing objects, a superconductive magnet device according to the invention includes: a pair of oppositely disposed superconductive magnet bodies in which annular superconductive coils are accommodated, and fine chip-shaped ferromagnetic shims disposed on a surface of the pair of superconductive magnet bodies, so as to improve uniformity of magnetic field in a uniform magnetic field space generated in the proximity of the center between the superconductive magnet bodies by means of the chip-shaped ferromagnetic shims. Furthermore Ring-shaped ferromagnetic shims are disposed concentrically with the center of the annular superconductive coils on the surface of the superconductive magnet bodies.

Accordingly, the adjustment of uniformity of magnetic field becomes easier, and number of units of annular superconductive coils and total magnetomotive force can be reduced.

Another superconductive magnet device according to the invention includes: annular superconductive coils accommodated in cryogenic containers in which liquid helium is sealed; a pair of oppositely disposed superconductive magnet bodies in which the cryogenic containers are accommodated in vacuum adiabatic containers; magnetic shield plates made of a ferromagnetic material respectively disposed on upper and lower sides of the oppositely disposed superconductive magnet bodies; ferromagnetic yokes that connects the magnetic shield plates respectively; a first supporting member through which the cryogenic container is supported by the vacuum adiabatic container; and a second supporting member through which the vacuum adiabatic container is supported by the magnetic shield plate. Furthermore Ring-shaped ferromagnetic shims disposed concentrically with the center of the annular superconductive coils are held by the vacuum adiabatic containers.

Accordingly, the first supporting member through which the cryogenic containers are supported by the vacuum adiabatic containers can be thinner, and therefore consumption of expensive liquid helium can be reduced.

A further superconductive magnet device according to the invention includes: a pair of oppositely disposed superconductive magnet bodies in which annular superconductive are accommodated; gradient magnetic field coils disposed between the pair of superconductive magnet bodies; a plurality of fine chip-shaped ferromagnetic shims disposed on a surface of the superconductive magnet bodies, so as to improve uniformity of magnetic field of a uniform magnetic field space generated by the fine chip-shaped ferromagnetic shims in the proximity of the center between the superconductive magnet bodies. Furthermore bar-shaped adjusters, on which the plurality of fine chip-shaped ferromagnetic shims can be mounted, are removably inserted into the surface of the superconductive magnet bodies from outer peripheral side of the superconductive magnet bodies.

Accordingly, since the fine chip-shaped ferromagnetic shims can be mounted and removed, uniformity of the magnetic field can be easily adjusted even under the condition that the gradient magnetic field coils are disposed.

BRIEF DESCRIPTION OF THE DRAWINGS

FIG. 1 is a perspective view showing a construction according to Embodiment 1 of the present invention.

FIG. 2 is a perspective view showing an essential part of FIG. 1.

FIG. 3 is a schematic sectional view of FIG. 1.

FIG. 4 is a sectional view showing an essential part of FIG. 1.

FIG. 5 is a sectional view showing a construction of according to Embodiment 2 of the invention.

FIG. 6 is an explanatory diagram showing a distribution of Z even number components generated by ring-shaped ferromagnetic shims according to Embodiment 3 of the invention.

FIGS. 7(a) and (b) are explanatory diagrams showing design results according to Embodiment 3 of the invention.

FIGS. 8(a) and (b) are explanatory drawings showing design results according to Embodiment 3 of the invention.

FIG. 9 is a schematic sectional view to explain Embodiment 4 of the invention.

FIG. 10 is a schematic sectional view showing a construction according to Embodiment 4 of the invention.

FIG. 11 is a perspective view showing a construction according to Embodiment 5 of the invention.

FIG. 12 is a schematic sectional view of FIG. 11.

FIG. 13 is a perspective view showing an essential part of FIG. 11.

FIG. 14 is a perspective view showing an essential part taken along the line IV—IV of FIG. 13.

FIG. 15 is a perspective view showing an essential part taken along the line V—V of FIG. 13.

FIG. 16 is a flowchart showing steps of adjustment of uniformity of magnetic field according to Embodiment 5 of the invention.

FIG. 17 is a perspective view showing a modification of a guide.

FIG. 18 is a perspective view showing an appearance of a conventional vertically opposed type superconductive magnet device used in MRI equipment.

FIG. 19 is a schematic sectional view of FIG. 18.

FIG. 20 is a schematic circuit diagram of FIG. 18.

FIG. 21 is an explanatory diagram showing constants of Legendre function.

DESCRIPTION OF THE PREFERRED EMBODIMENTS

Embodiment 1.

FIG. 1 is a perspective view showing a construction according to Embodiment 1, FIG. 2 is a perspective view showing an essential part of FIG. 1, FIG. 3 is a schematic sectional view of FIG. 1, and FIG. 4 is a sectional view showing an essential part of FIG. 1. Referring to FIGS. 1 to 4, reference numeral 24 is a vacuum adiabatic container placed on the upper side, and in the center of which a bore portion 24a is provided. Numeral 25 is a cryogenic container accommodated inside vacuum adiabatic container 24 and in which liquid helium is sealed. Numeral 26 is an annular superconductive coil accommodated in the cryogenic container 25. The mentioned components 24 to 26 as a whole form a superconductive magnet body 27. Numeral 28 is a vacuum adiabatic container disposed oppositely on the lower part with a predetermined clearance from the vacuum adiabatic container 24, and is provided with a bore portion 28a at the center portion. Numeral 29 is a cryogenic container accommodated inside vacuum adiabatic container 28, and in which liquid helium is sealed. Numeral 30 is an annular superconductive coil accommodated in the cryogenic container 29. The mentioned components 28 to 30 as a whole form a superconductive magnet body 31. Numerals 32 and 33 are connecting tubes connecting two vacuum adiabatic containers 24, 28, and numeral 34 is a permanent current switch disposed in the lower cryogenic container 29. Numeral 35 is a coil protection element disposed in the lower cryogenic container 29 and connected to between the ends of the annular superconductive coil 26. Numeral 36 is a coil protection element disposed in cryogenic container 29 and connected to between the ends of annular superconductive coil 30.

Numerals 37 and 38 are magnetic shield plates made of a ferromagnetic body, placed on the upper and lower sides of the superconductive magnet bodies 27, 31 oppositely disposed. Numerals 39 and 40 are yokes of a ferromagnetic material for connecting the two magnetic shield plates 37, 38. Numerals 41a, 41b, 42a and 42b are grooves formed respectively on the surfaces of the superconductive magnet bodies 27, 31, and which are respectively disposed concentrically with the annular superconductive coils 26, 30. Numerals 43a, 43b are grooves formed on the bore portion 24a of superconductive magnet body 27, and numerals 44a, 44b are grooves formed on the bore portion 28a of superconductive magnet body 31. Numerals 45 to 48 are ring-shaped ferromagnetic shims made of an iron or silicon steel foil wound round as shown in FIG. 2, and which are respectively disposed in the grooves 41a, 41b and grooves 42a, 42b. Numerals 49, 50 are ring-shaped ferromagnetic shims made of an iron or silicon steel foil wound round as shown in FIG. 2, and are respectively disposed in the grooves 43a, 43b and grooves 44a, 44b. Numerals 51, 52 are fine chip-shaped ferromagnetic shims made of iron or silicon steel, and a plurality of them are respectively disposed on the surfaces of the superconductive magnet body 27 and superconductive magnet body 31.

Numerals 53, 54 are fine chip-shaped ferromagnetic shims made of iron or silicon steel, and a plurality of them are disposed on the bore portion 24a of the superconductive magnet body 27 and on the bore portion 28a of the superconductive magnet body 31 respectively. Numeral 55 is an image pickup area secured between the two superconductive magnet bodies 27, 31.

In the mentioned arrangement, when the ring-shaped ferromagnetic shims are mounted only on either side of the superconductive magnet body 27 or 31, only such Z components as having an odd number as n are generated among the (0, n) Z components. On the other hand, when the same volume of ring-shaped ferromagnetic shims is mounted at the same positions on both of superconductive magnet bodies 27, 31, only such Z components as having an even number as n are generated. Therefore, in the practical use, volume of the ring-shaped ferromagnetic shims to be mounted on the upper and lower superconductive magnet bodies 27, 31 at respective parts is adjusted according to error magnetic field components to be compensated and the amount of error.

In the calculation for the adjustment of magnet field, it is supposed that a piece of ring-shaped ferromagnetic shim is equivalent to the conventional ferromagnetic shim that generates only Z components. And, in case of FIG. 1, it is preferable to analyze the amount that achieves the optimum compensation on the basis of (number of conventional ferromagnetic shims)+(two pieces each on upper and lower sides, i.e., total four pieces of ferromagnetic shims that generate only Z components).

As described above, the adjustment of uniformity of magnetic field can be easily performed just by disposing the ring-shaped ferromagnetic shims 45 to 48 concentrically with the center of the superconductive magnet bodies 27, 31 thereby generating specified Z components, instead of reducing all the error magnetic field components to substantially zero at the stage of designing the annular superconductive coils. Moreover, number of annular superconductive coils and total magnetomotive force can be reduced.

In the foregoing description of Embodiment 1, the ring-shaped ferromagnetic shims 45 to 50 are disposed on the facing surfaces of the respective superconductive magnet bodies 27, 31 and on the respective bore portions 24a, 28a. It is, however, to be understood that similar advantages can be attained even when the ring-shaped ferromagnetic shims 49, 50 are not provided on the bore portions 24a, 28a.
Embodiment 2.

FIG. 5 is sectional view showing a construction of Embodiment 2. Referring to FIG. 5, the superconductive magnet bodies 27, 31 are designated to like parts as in the foregoing Embodiment 1. However, the ring-shaped ferromagnetic shims 45 to 50 are not disposed on either of the superconductive magnet bodies 27, 31. Numeral 56 is a disc-shaped holding member fixed to the superconductive magnet body 27 at its surface opposing to the superconductive magnet body 31, and on which grooves 56a, 56b are formed concentrically with the annular superconductive coil 26 shown in FIG. 3. Numeral 57 is a disc shape holding member fixed to the superconductive magnet body 31 at its surface opposing to the superconductive magnet body 27, and on which grooves 57a, 57b are formed in concentrically with the annular superconductive coil 30 shown in FIG. 3. Numeral 58 is a cylindrical holding member fixed into the bore portion 24a of the superconductive magnet body 27, and on which grooves 58a, 58b are formed concentrically with the annular superconductive coil 26 shown in FIG. 3. Numeral 59 is a cylindrical holding member fixed into the bore portion 28a of the superconductive magnet body 31, and on which grooves 59a, 59b are formed concentrically with the annular the superconductive coil 30 shown in FIG. 3.

In the mentioned arrangement, the ring-shaped ferromagnetic shims 45, 46 of FIG. 3 are disposed in the grooves 56a, 56b of the holding member 56, and likewise the ring-shaped ferromagnetic shims 47, 48 of FIG. 3 are disposed in the grooves 57a, 57b of the holding member 57. Further, the ring-shaped ferromagnetic shims 49 are disposed in the grooves 58a, 58b of the holding member 58 disposed in the bore portion 24a, and likewise the ring-shaped ferromagnetic shims 50 are disposed in the grooves 59a, 59b of the holding member 59 disposed in the bore portion 28a.

As described above, the ring-shaped ferromagnetic shims 45, 46 are disposed in the grooves 56a, 56b of the holding member 56 on the side of the superconductive magnet body 27, and the ring-shaped ferromagnetic shims 47, 48 are disposed in the grooves 57a, 57b of the holding member 57 on the side of the superconductive magnet body 31. Likewise, the ring-shaped ferromagnetic shims 49 are disposed in grooves 58a, 58b of the bore portion 24a in superconductive magnet body 27, and the ring-shaped ferromagnetic shims 50 are disposed in the grooves 59a, 59b of the bore portion 28a in the superconductive magnet body 31. As a result of such arrangement, positioning precision of the grooves 56a to 59a and 56b to 59b can be improved and it becomes easier to mount the ring-shaped ferromagnetic shims 45 to 50, and after all work efficiency is improved.
Embodiment 3.

FIG. 6 is an explanatory diagram showing a distribution of Z even number components generated by ring-shaped ferromagnetic shims according to Embodiment 3.

When designing a group of annular superconductive coils, it is understood that generating some amount of certain Z even number components is more effective for reducing number of annular superconductive coils and total magnetomotive force, rather than adjusting all the error magnetic field components to substantially zero by the annular superconductive coils group alone. In the practical designing, there are various solutions depending on conditions such as restriction in number of annular superconductive coils, manufacturing method thereof, area available for placement, restriction on electromagnetic force, restriction on maximum magnetic field intensity, etc.

FIG. 6 shows variation between outputs of (0, 2) to (0, 8) components and the ring-shaped ferromagnetic shims of different radius when the ring-shaped ferromagnetic shims of a constant thickness are disposed on the gap side surfaces of the oppositely disposed superconductive magnet bodies. (However, in the area of not more than 300 mm in radius, thickness of the ring-shaped ferromagnetic shims is established to be approximately one fifth of those in the area of not less than 400 mm in radius).

Referring to FIG. 6, it is understood that, in the area of smaller radius, output of each component is larger and moreover both positive and negative values are obtained. On the other hand, in the area of larger radius, output of each component is smaller and only either positive or negative value is obtained.

It is also understood that disposing a plurality of ring-shaped ferromagnetic shims can generate magnetic field components having various types of variation and further by varying thickness thereof.

FIG. 7 shows an example of a design result under substantially the same uniformity of magnetic field of the image pickup area. In this design result, arrangement of annular superconductive coil group 26 shown in FIG. 7(a) has been changed to that shown in FIG. 7(b) by adding three pieces of ring-shaped ferromagnetic shims 45, 46 and 49. Thus magnetomotive force of the entire group of annular superconductive coils 26 can be reduced by approximately 5%.

FIG. 8 is a design example in which uniformity of magnetic field in the image pickup area is further improved. It is certain that the uniformity is improved by increasing number of annular superconductive coils 26. In this case, however, components of (0, 10) or more will gradually become a major problem. Therefore, instead of providing an annular superconductive coil group consisting of five pieces as shown in FIG. 8(a), it is preferable to dispose a plurality of ring-shaped ferromagnetic shims 45, 46, 49, 60 and 61 as shown in FIG. 8(b). In this manner, error components can be lightened and number of the annular superconductive coils 26 can be reduced. It is a matter of course that, since the output distribution in FIG. 6 depends on the manner of disposing the annular superconductive coils 26 group, for the purpose of more precise adjustment, the distribution has to be gradually converged while performing corrections of the output distribution according to the arrangement design of the annular superconductive coils 26 group.

In the foregoing descriptions of Embodiments 1 to 3, each device provided with magnetic shield plates 37, 38 is described, however, it is to be understood that like advantages can be attained even without magnetic shield plates 37, 38.

Embodiment 4.

FIG. 9 is a schematic sectional view showing an upper part of a vertical split type superconductive magnet device without ring-shaped ferromagnetic shims. Referring to FIG. 9, numerals 24 to 27 and 37 are designated to like parts as those in the foregoing Embodiment 1. Numeral 62 is a first supporting member by which the vacuum adiabatic container 24 supports the cryogenic container 24. Numeral 63 is a second supporting member by which the magnetic shield plate 37 supports the vacuum adiabatic container 24.

In the mentioned arrangement, all (100%) of the electromagnetic force applied to the annular superconductive coil 26 group is received by the vacuum adiabatic container 24 through the first supporting members 62, and then sustained by the magnetic shield plate 37 through the second supporting members 63.

Now, FIG. 10 shows Embodiment 4 in which the ring-shaped ferromagnetic shims used in initial setting and specified at the designing stage are disposed on the surface of superconductive magnet body 27, in a region where radius of the annular superconductive coils is large. Referring to FIG. 10, numerals 24 to 27 and 37 are designated to like parts as in the foregoing Embodiment 1. Numeral 64 is a ring-shaped ferromagnetic shim used in initial setting and specified at the designing stage, made of an iron or silicon steel foil wound round as shown in FIG. 2. The ring-shaped ferromagnetic shim 64 is disposed on the surface of the superconductive magnet body 27 in a region where radius R of the annular superconductive coils is large.

In the mentioned arrangement, the region where radius R of annular superconductive coil 26 is large has high magnetic field intensity, and therefore an intense electromagnetic force is applied from the group of annular superconductive coils 26 to the ring-shaped ferromagnetic shim 64. On the contrary, the electromagnetic force received by the group of annular superconductive coils 26 in the direction of magnetic shield plate 37 drops to, for example, 87% of the total electromagnetic force generated by the annular superconductive coils 26. There is no significant change in the total electromagnetic force of the group of annular superconductive coils 26 and the ring-shaped ferromagnetic shim 64. However, since the electromagnetic force of the ring-shaped ferromagnetic shim 64 is supported by the magnetic shield plate 37 through the second supporting members 63, the electromagnetic force supported by the first supporting members 62 is reduced. The first supporting members 62 are closely involved in heat intrusion into the cryogenic container 25, and therefore consumption of liquid helium that is very expensive can be reduced by thinning the first supporting members.

In the foregoing descriptions of Embodiments 1 to 4, a vertical split type superconductive magnet device of uniform magnet field is described, however, like advantages can be attained also by a horizontal split type device wherein superconductive magnet bodies 27, 31 are horizontally opposed.

Further, in the foregoing descriptions of Embodiments 1 to 4, a superconductive magnet device for MRI is described, however, like advantages can be attained by the invention also in the aspects of improvement in magnetic field configuration or reduction in electromagnetic force of any other split type superconductive magnet device.

Further, the ring-shaped ferromagnetic shims employed in the foregoing Embodiments 1 to 4 can be substituted with a plurality of conventional fine chip-shaped ferromagnetic shims circularly arranged, which will also provide like advantages.

Embodiment 5.

FIG. 11 is a perspective view showing a construction according to Embodiment 5, FIG. 12 is a schematic sectional view of FIG. 11, and FIG. 13 is a perspective view showing an essential part of FIG. 11. FIG. 14 is a perspective view showing an essential part taken along the line IV—IV of FIG. 13, and FIG. 15 is a perspective view showing an essential part taken along the line V—V of FIG. 13. Referring to FIGS. 11 to 15, numeral 126 is a vacuum adiabatic container placed on the upper side and provided with a bore portion 126a through its center. Numeral 127 is a cryogenic container accommodated in the vacuum adiabatic container 126 and in which liquid helium is sealed. Numeral 128 is an annular superconductive coil disposed in the cryogenic container 127. The mentioned components 126 to 128 form a superconductive magnet body 129. Numeral 130 is another vacuum adiabatic container placed on the lower side oppositely to the vacuum adiabatic container 126 with a predetermined clearance therefrom, and provided with a bore portion 130a through its center. Numeral 131 is a cryogenic container accommodated inside vacuum adiabatic container 130 and in which liquid helium is sealed. 132 is an annular superconductive coil disposed in the cryogenic container 131. The mentioned components 130 to 132 form a superconductive magnet body 133. Numerals 134 and 135 are connecting tubes for connecting the two vacuum adiabatic containers 126, 130, and numerals 136 and 137 are magnetic shield plates made of a ferromagnetic body and disposed on upper and lower sides of the oppositely disposed superconductive magnet bodies 129, 133. Numerals 138 and 139 are yokes made of a ferromagnetic body for connecting the two magnetic shield plates 136, 137. Numerals 140 and 141 are fine chip-shaped ferromagnetic shims made of iron or silicon steel, and a plurality of them are disposed on the respective surfaces of the superconductive magnet body 129 and superconductive magnet body 133. Numerals 142 and 143 are fine chip-shaped ferromagnetic shims made of iron or silicon steel and a plurality of them are disposed on the bore portion 126a of the superconductive magnet body 129 and on the bore portion 130a of the superconductive magnet body 133 respectively. Numeral 144 is an image pickup area secured between the two superconductive magnet bodies 129 and 133.

Numerals 145 and 146 are bar-shaped adjusters radially disposed on the surfaces of the superconductive magnet bodies 129, 133 respectively in such a manner as allowing insertion or removal through the outer peripheral side of the superconductive magnet bodies 129, 133 and respectively provided with fixing portions 145a, 145b at one end thereof. A plurality of fine chip-shaped ferromagnetic shims 147 made of iron or silicon steel are mounted on the bar-shaped adjusters 145, 146 as shown in FIGS. 14 and 15. Numerals 148 and 149 are a plurality of guides radially disposed on the surfaces of superconductive magnet bodies 129, 133 respectively and having an opening along the opposite side of the surface of the superconductive magnet bodies 129, 133 so that bar-shaped adjusters 145, 146 can be removably inserted. Further, the guides 148, 149 are respectively provided with engaging holes 148a, 149a at their end closer to the center of the superconductive magnet bodies 129, 133, for engaging with the fixing portions 145a, 146a of the bar-shaped adjusters 145, 146. Note that the guides 148, 149 are provided for facilitating disposition of the fine chip-shaped ferromagnetic shims 147 at a specified position against the electromagnetic force applied to fine chip-shaped ferromagnetic shims 147, at the time of inserting the bar-shaped adjusters 145, 146 into the superconductive magnet bodies 129, 133. Numerals 150 and 151 are gradient magnet field coils for generating an gradient magnet field to be applied in the form of pulsation to the image pickup area 144 at the time of picking up an image. The gradient magnet field coils 150, 151 are placed between the superconductive magnet bodies 129, 133 to be opposite to them respectively.

Now, steps for adjusting uniformity of the magnetic field in the image pickup area 44 are hereinafter described. FIG. 16 is an explanatory flowchart of the steps for adjusting uniformity of the magnetic field. Referring to FIG. 16, first a superconductive magnet device is installed in place and cooled (Step S1). Then the annular superconductive coils 128, 132 are magnetized up to their rating by a magnetization power source not shown (Step S2). When completing the rated magnetization, an error magnetic field of several tens to several hundreds ppm is generated due to tolerance or material characteristics of the annular superconductive coils 128, 132 and other members and influence of magnetic materials in the proximity of the superconductive magnet bodies 129, 133. To cope with this, an adjustment of uniformity of the magnetic field is repeatedly performed in all the regions including the superconductive magnet bodies 129, 133, bore portions 126a, 132a, the respective fine chip-shaped ferromagnetic shims 140 to 143 and 147 on the bar-shaped adjusters 145, 146. The adjustment of uniformity of the magnetic field is repeated usually until it comes to nearly several ppm that is a target (Step S3). At this time, the gradient magnet field coils 150, 151 are mounted (Step S4). As a result, the uniformity of magnetic field is usually deteriorated by several ppm due to a minute magnetism existing in the gradient magnetic field coils 150, 151, fixtures for fixing the gradient magnetic coils, etc. The uniformity of magnetic field is also deteriorated due to a slight flexure of the superconductive magnet bodies 129, 133 caused by the weight of the gradient magnet field coils 150, 151.

Under the condition of the gradient magnet field coils 150, 151 being mounted, the bar-shaped adjusters 145, 146 are drawn out of the outer peripheral side of the superconductive magnet bodies 129, 133 for adding or reducing the fine chip-shaped ferromagnetic shims 147. Then the bar-shaped adjusters 145, 146 are inserted again through the outer peripheral side of the superconductive magnet bodies 129, 133 as shown in FIGS. 14 and 15. Thus the portions 145a, 146a on one end of the bar-shaped adjusters 145, 146 are engaged with the engaging holes 148a, 149a of the guides 148, 149. The other ends of the bar-shaped adjusters 145, 146 are fixed by fixing means (not shown). Upon performing such final fine adjustment of uniformity of the magnetic field (Step S5), uniformity of the magnetic field is measured. Then attaching or removing of fine chip-shaped ferromagnetic shims 147 is repeatedly performed until the target uniformity of the magnetic field is achieved.

In this Embodiment 5, a plurality of fine chip-shaped ferromagnetic shims 147 are mounted on bar-shaped adjusters 145, 146, and it is preferable to mount a larger number of fine chip-shaped ferromagnetic shims 147 on the forward end portion of the bar-shaped adjusters 145, 146, in other words, on the region closer to the center of the superconductive magnet bodies 129, 133 where uniformity adjusting performance is greater. It is also preferable to densely mount a larger number of fine chip-shaped ferromagnetic shims whose size becomes smaller toward the forward portion of the bar-shaped adjusters 145, 146, which makes it possible to perform the final fine adjustment more easily.

In this Embodiment 5, the guides 148, 149 have an opening on the opposite side of the surface of the superconductive magnet bodies 129, 133. However, it is also preferable to employ box shape guides 152, 153 having a closed face on the opposite side of the surface of the superconductive magnet bodies 129, 133 as shown in FIG. 17.

Further, in this Embodiment 5, a vertical split type superconductive magnet device with magnetic shield for use in MRI is described. However, it is to be understood that the same advantages can be attained by the invention, regardless of whether or not there are provided such magnetic shields or whether the device is of vertically split type or for use in MRI.

Furthermore, the same advantages can be achieved by employing the bar-shaped adjuster 145, 146 and guides 152, 153 that are modified into any other form or arrangement.

What is claimed is:

1. A superconductive magnet device comprising:
    a first superconductive magnet body and a second superconductive magnet body, wherein the first and second superconductive magnet bodies have surfaces that are disposed so as to oppose one another;
    annular superconductive coils disposed within the first and second superconductive magnet bodies;
    a holding member coupled to at least one of said surfaces of the first and second superconductive magnet bodies, and
    ring-shaped shims disposed on the holding member.

2. The superconductive magnet device according to claim 1, wherein the ring-shaped shims are disposed along grooves formed on the surface of the holding member.

3. The superconductive magnet device according to claim 1, wherein the first and second superconductive magnet bodies respectively include a vacuum adiabatic container and a cryogenic container.

4. The superconductive magnet device according to claim 1, wherein the first and second superconductive magnet bodies extend radially so as to be parallel with the holding member.

5. The superconductive magnet device according to claim 1, wherein the holding member is coupled to at least one of the first and second superconductive magnet bodies so as to be positioned in an area between the first and the second superconductive magnetic bodies.

6. The superconductive magnet device according to claim 1, wherein two holding members are provided such that the first superconductive magnetic body is positioned in an area directly above one of the holding members and the second superconductive magnetic body is positioned in an area directly below the other of the holding members.

7. The superconductive magnet device according to claim 1, wherein the holding member contacts the at least one of the surfaces of the first and second superconductive magnet bodies.

* * * * *